United States Patent
Hirobe (10) Patent No.: US 12,407,309 B2
(45) Date of Patent: Sep. 2, 2025

(54) RADIO-FREQUENCY CIRCUIT AND COMMUNICATION DEVICE

(71) Applicant: Murata Manufacturing Co., Ltd., Kyoto (JP)

(72) Inventor: Masakazu Hirobe, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 500 days.

(21) Appl. No.: 18/055,439

(22) Filed: Nov. 15, 2022

(65) Prior Publication Data

US 2023/0077189 A1 Mar. 9, 2023

Related U.S. Application Data (63) Continuation of application No. PCT/JP2021/002727, filed on Jan. 27, 2021.

(30) Foreign Application Priority Data

Jun. 19, 2020 (JP) ................ 2020-106480

(51) Int. Cl.
H03F 1/30 (2006.01)
H03F 3/24 (2006.01)

(52) U.S. Cl.
CPC ....... *H03F 3/245* (2013.01); *H03F 2200/451* (2013.01); *H03F 2200/78* (2013.01)

(58) Field of Classification Search
CPC ................. H03F 1/30; H03F 3/191
USPC ................. 330/297, 302
See application file for complete search history.

(56) References Cited

U.S. PATENT DOCUMENTS

| | | |
|---|---|---|
| 2005/0032488 A1 | 2/2005 | Pehlke et al. |
| 2005/0206455 A1 | 9/2005 | Yamazaki et al. |
| 2010/0041354 A1 | 2/2010 | Ng et al. |
| 2018/0262165 A1 | 9/2018 | Ishihara et al. |

FOREIGN PATENT DOCUMENTS

| | | |
|---|---|---|
| JP | H11-168395 A | 6/1999 |
| JP | 2008-506337 A | 2/2008 |
| JP | 2010-016794 A | 1/2010 |

(Continued)

OTHER PUBLICATIONS

International Search Report for PCT/JP2021/002727 dated Mar. 23, 2021.

*Primary Examiner* — Henry Choe
(74) *Attorney, Agent, or Firm* — McDonald Hopkins LLC (57) ABSTRACT

A radio-frequency circuit includes an amplifier circuit, a bias circuit, a bias control circuit, a comparing section, a variable resistance circuit, and a control unit. The amplifier circuit includes a transistor that amplifies a radio-frequency signal input to an input terminal and outputs the radio-frequency signal from an output terminal. The bias circuit supplies a bias current or a bias voltage to the input terminal of the transistor. The comparing section compares a threshold voltage with a power supply voltage of a power supply terminal connected to the output terminal of the transistor. The variable resistance circuit is connected between the power supply terminal and the output terminal. The variable resistance circuit includes a parallel circuit made up of a resistive element and a switch element. The control unit changes a resistance value of the variable resistance circuit in accordance with a compared result of the comparing section.

10 Claims, 3 Drawing Sheets

(56) References Cited

FOREIGN PATENT DOCUMENTS

| JP | 2011-124621 A | 6/2011 |
|----|---------------|--------|
| JP | 2012-178675 A | 9/2012 |
| JP | 6359928 B2    | 7/2018 |
| JP | 2018-152714 A | 9/2018 |

RADIO-FREQUENCY CIRCUIT AND COMMUNICATION DEVICE

CROSS REFERENCE TO RELATED APPLICATION

This is a continuation of International Application No. PCT/JP2021/002727 filed on Jan. 27, 2021 which claims priority from Japanese Patent Application No. 2020-106480 filed on Jun. 19, 2020. The contents of these applications are incorporated herein by reference in their entireties.

BACKGROUND ART

Technical Field

The present disclosure generally relates to a radio-frequency circuit and a communication device and, more specifically, to a radio-frequency circuit including an amplifier circuit, and a communication device including the radio-frequency circuit.

Hitherto, a power amplifier module that includes a power amplifier circuit and a bias circuit is known (see, for example, Patent Document 1).

The amplifier circuit includes an amplifier. The amplifier includes a common-emitter transistor. The collector of the transistor is connected to a power supply voltage through an inductance element.

The bias circuit includes an emitter follower transistor and a control IC. The control IC includes a first current source and a second current source. The first current source supplies the collector of the emitter follower transistor with a control current that changes following a change in control voltage. The first current source limits the control current to less than or equal to an upper limit. The second current source supplies the base of the emitter follower transistor with a constant current.

Patent Document 1: Japanese Unexamined Patent Application Publication No. 2018-152714

BRIEF SUMMARY

In the power amplifier module described in Patent Document 1, when the power supply voltage is higher than a rated power supply voltage, there have been variations in bias current or bias voltage supplied to the base of, for example, the transistor of the amplifier because of the influence of variations in $h_{fe}$ (output short-circuit current gain) of the emitter follower. Therefore, with the power amplifier module described in Patent Document 1, the characteristics of at least one of the amplifier circuit and an electronic component to which a radio-frequency signal amplified by the amplifier circuit is input sometimes degrade.

The present disclosure to provides a radio-frequency circuit and a communication device capable of further accurately limiting the output power of an amplifier circuit.

A radio-frequency circuit according to an aspect of the present disclosure includes an amplifier circuit, a bias circuit, a bias control circuit, a comparing section, a variable resistance circuit, and a control unit. The amplifier circuit includes a specific transistor. The specific transistor has an input terminal and an output terminal. The specific transistor amplifies a radio-frequency signal input to the input terminal and outputs the radio-frequency signal from the output terminal. The bias circuit supplies a bias current or a bias voltage to the input terminal of the specific transistor. The bias control circuit supplies a control current or a control voltage to the bias circuit. The comparing section compares a threshold voltage with a power supply voltage of a power supply terminal connected to the output terminal of the specific transistor. The variable resistance circuit is connected between the power supply terminal and the output terminal. The variable resistance circuit includes a parallel circuit made up of a resistive element and a switch element. The control unit changes a resistance value of the variable resistance circuit in accordance with a compared result of the comparing section.

A communication device according to an aspect of the present disclosure includes the radio-frequency circuit and a signal processing circuit. The signal processing circuit is connected to the radio-frequency circuit.

The radio-frequency circuit and the communication device according to the above-described aspects of the present disclosure are capable of further accurately limiting the output power of the amplifier circuit.

DETAILED DESCRIPTION

Figure 1:
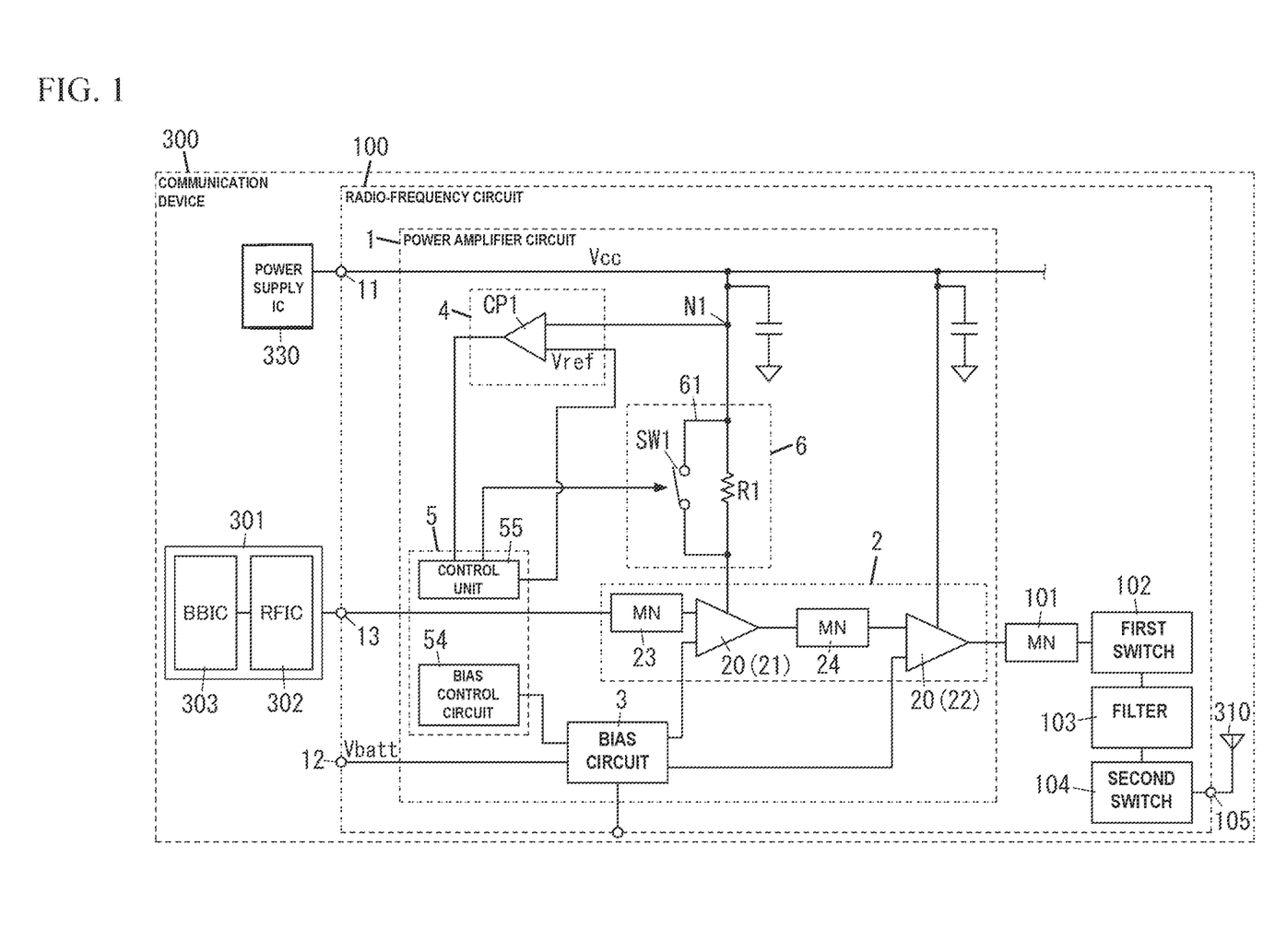
FIG. 1 is a circuit diagram of a communication device including a radio-frequency circuit according to an embodiment.

Hereinafter, a radio-frequency circuit 100 and a communication device 300 according to an embodiment will be described with reference to FIGS. 1 and 2.

(1) Radio-Frequency Circuit and Communication Device (1.1) Circuit Configuration of Radio-Frequency Circuit and Communication Device The radio-frequency circuit 100 is used in, for example, the communication device 300. The communication device 300 is, for example, a mobile phone (for example, a smartphone); however, the configuration is not limited thereto. The communication device 300 may be, for example, a wearable terminal (for example, a smart watch). The radio-frequency circuit 100 is, for example, a circuit that supports a 4G (fourth generation mobile communication) standard, a 5G (fifth generation mobile communication) standard, or the like. The 4G standard is, for example, a third generation partnership project (3GPP) long term evolution (LTE) standard. The 5G standard is, for example, 5G new ratio (NR). The radio-frequency circuit 100 may be a circuit that supports carrier aggregation and dual connectivity.

The radio-frequency circuit 100 is, for example, configured to be capable of amplifying a transmission signal input from the signal processing circuit 301 and outputting the transmission signal to an antenna 310. The signal processing circuit 301 is not a component element of the radio-frequency circuit 100 but a component element of the communication device 300 that includes the radio-frequency circuit 100. The radio-frequency circuit 100 is, for example, controlled by the signal processing circuit 301 of the communication device 300. The communication device 300 includes the radio-frequency circuit 100 and the signal processing circuit 301. The communication device 300 further includes the antenna 310. The signal processing circuit 301 includes, for example, an RF signal processing circuit 302 and a baseband signal processing circuit 303. The RF signal processing circuit 302 is, for example, a radio frequency integrated circuit (RFIC), and performs signal processing on a radio-frequency signal. The RF signal processing circuit 302, for example, performs signal processing on a radio-frequency signal (transmission signal) output from the baseband signal processing circuit 303 by up conversion, or the like and outputs the processed radio-frequency signal. The baseband signal processing circuit 303 is, for example, a baseband integrated circuit (BBIC). The baseband signal processing circuit 303 generates an I-phase signal and a Q-phase signal from a baseband signal. The baseband signal is, for example, an audio signal, an image signal, or the like input from the outside. The baseband signal processing circuit 303 performs IQ modulation process by synthesizing the I-phase signal with the Q-phase signal and outputs a transmission signal. At this time, the transmission signal is generated as a modulation signal (IQ signal) obtained by modulating the amplitude of a carrier wave signal with a predetermined frequency at a period longer than the period of the carrier wave signal. The radio-frequency circuit 100 transmits a radio-frequency signal (transmission signal) between the antenna 310 and the RF signal processing circuit 302 of the signal processing circuit 301.

The radio-frequency circuit 100 includes a power amplifier circuit 1. The radio-frequency circuit 100 further includes an output matching circuit 101, a first switch 102, a filter 103, a second switch 104, and an antenna terminal 105.

The power amplifier circuit 1 includes an amplifier circuit 2. The amplifier circuit 2, for example, amplifies an input signal input from the signal processing circuit 301 via a signal input terminal 13 of the radio-frequency circuit 100 and outputs the input signal. The input signal is a radio-frequency signal (transmission signal) in a predetermined frequency band. The predetermined frequency band includes, for example, a plurality of communication bands different from each other. The amplifier circuit 2 has a plurality of (for example, two) amplifiers 20.

Figure 2:
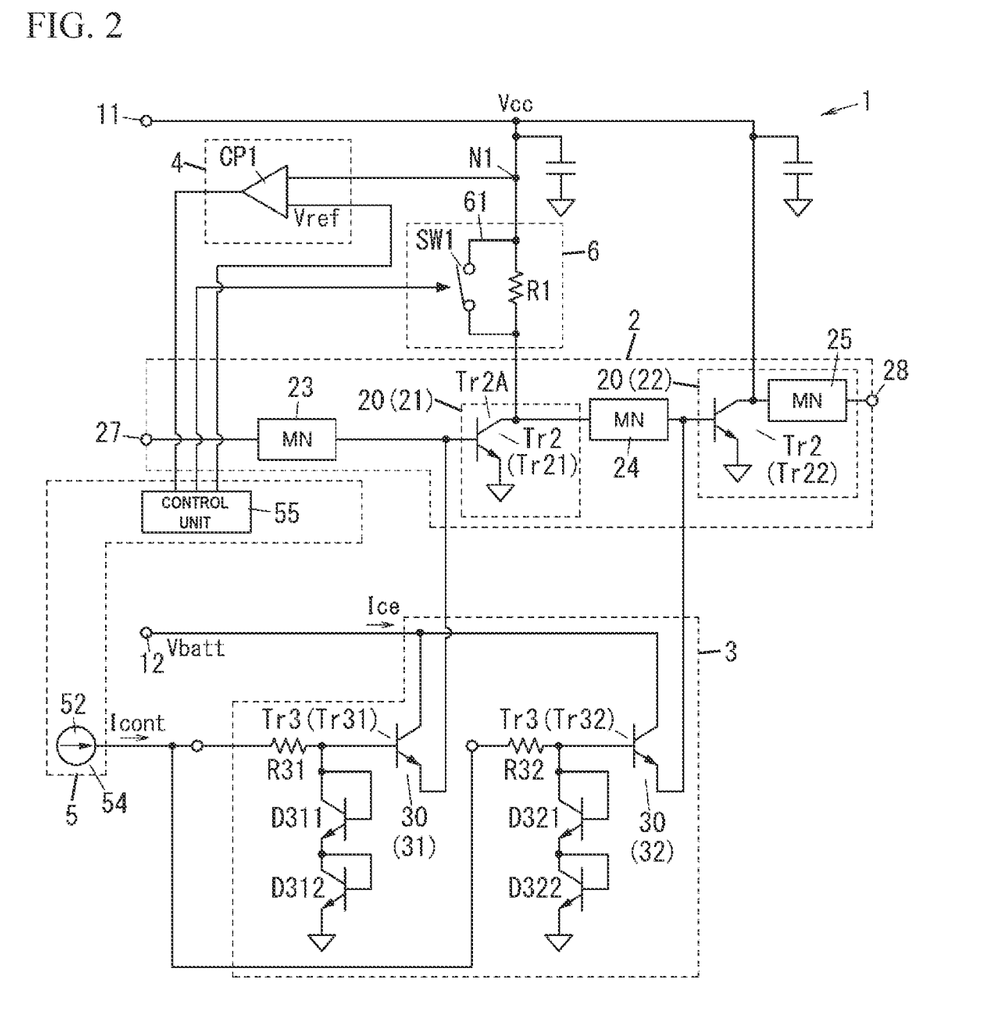
FIG. 2 is a circuit diagram of the above-described radio-frequency circuit.

Each of the plurality of amplifiers 20 includes an amplifier transistor Tr2 (see FIG. 2). Each of the plurality of transistors Tr2 has an input terminal and an output terminal. Each of the plurality of transistors Tr2 has an input/output common terminal. Each of the plurality of transistors Tr2 is, for example, a bipolar transistor. In this case, the input terminal, output terminal, and common terminal of the transistor Tr2 are respectively the base, collector, and emitter of the bipolar transistor. In the amplifier circuit 2, the common terminal (emitter) of each transistor Tr2 is connected to a ground (grounded).

In the amplifier circuit 2, the plurality of amplifiers 20 is connected in multiple stages. Therefore, in the amplifier circuit 2, the plurality of transistors Tr2 is connected in multiple stages. Hereinafter, for the sake of convenience of description, of the plurality of amplifiers 20, the amplifier 20 in the first stage (driver stage) is referred to as first-stage amplifier 21, and the amplifier 20 in the final stage is referred to as final-stage amplifier 22. Of the plurality of transistors Tr2, the transistor Tr2 in the first stage (driver stage) is referred to as first-stage transistor Tr21, and the transistor Tr2 in the final stage (output stage) is referred to as final-stage transistor Tr22.

The amplifier circuit 2 further includes a matching circuit 23 provided between an input terminal 27 and the first-stage amplifier 21, and a matching circuit 24 provided between the first-stage amplifier 21 and the final-stage amplifier 22. The matching circuit 23 is a circuit for matching the impedance between the first-stage amplifier 21 and the signal processing circuit 301. The matching circuit 24 is a circuit (inter-stage matching circuit) for matching the impedance between the first-stage amplifier 21 and the final-stage amplifier 22.

The output matching circuit 101 is provided in a signal path between the amplifier circuit 2 and the first switch 102. The output matching circuit 101 is a circuit for matching the impedance between the amplifier circuit 2 and the filter 103. The output matching circuit 101 is made up of, for example, one inductor; however, the configuration is not limited thereto. The output matching circuit 101 may include, for example, a plurality of inductors and a plurality of capacitors.

The first switch 102 is provided between the output matching circuit 101 and the filter 103. The first switch 102 has a common terminal and a plurality of selection terminals. The common terminal of the first switch 102 is connected to the amplifier circuit 2 via the output matching circuit 101. One of the plurality of selection terminals of the first switch 102 is connected to the filter 103. The first switch 102 is, for example, a switch capable of connecting at least one of the plurality of selection terminals to the common terminal. Here, the first switch 102 is, for example, a switch capable of one-to-one connection and one-to-multiple connection. The first switch 102 is a switch capable of switching between signal paths for a plurality of transmission signals in communication bands different from each other. The first switch 102, for example, switches a connection status between the common terminal and the plurality of selection terminals in accordance with a control signal input from the signal processing circuit 301. The first switch 102 is, for example, a switch integrated circuit (IC).

The filter 103 is a filter that has a transmission band of at least one communication band (for example, Band 3) of the above-described plurality of communication bands as a pass band. The filter 103 is, for example, a one-chip acoustic wave filter, and each of a plurality of series arm resonators and a plurality of parallel arm resonators is made up of an acoustic wave resonator. The acoustic wave filter is, for example, a surface acoustic wave filter that uses surface acoustic waves. In the surface acoustic wave filter, each of the plurality of series arm resonators and the plurality of parallel arm resonators is, for example, a surface acoustic wave (SAW) resonator.

The second switch 104 is provided between the filter 103 and the antenna terminal 105. The second switch 104 is a switch connected to the antenna terminal 105. The second switch 104 has a common terminal and a plurality of selection terminals. In the second switch 104, the common terminal is connected to the antenna terminal 105. The filter 103 is connected to one of the plurality of selection terminals of the second switch 104. The second switch 104, for example, switches a connection status between the common terminal and the plurality of selection terminals in accordance with a control signal input from the signal processing circuit 301. The second switch 104 is, for example, a switch IC.

The antenna terminal 105 is connected to the antenna 310.

In the radio-frequency circuit 100, a transmission signal output from the amplifier circuit 2 is transmitted to the antenna 310 through the output matching circuit 101, the first switch 102, the filter 103, the second switch 104, and the antenna terminal 105.

(1.2) Circuit Configuration of Power Amplifier Circuit

As shown in FIG. 2, the power amplifier circuit 1 includes the amplifier circuit 2, a bias circuit 3, a bias control circuit 54, a comparing section 4, a variable resistance circuit 6, and a control unit 55. The amplifier circuit 2 includes a specific transistor Tr2A (for example, the first-stage transistor Tr2). The specific transistor Tr2A has an input terminal and an output terminal. The specific transistor Tr2A amplifies a radio-frequency signal input to the input terminal and outputs the radio-frequency signal from the output terminal. The bias circuit 3 supplies a bias current to the input terminal of the specific transistor Tr2A; however, the configuration is not limited thereto. The bias circuit 3 may be configured to supply a bias voltage to the input terminal of the specific transistor Tr2A. The bias control circuit 54 supplies a control current Icont to the bias circuit 3; however, the configuration is not limited thereto. The bias control circuit 54 may be configured to supply a control voltage to the bias circuit 3. The comparing section 4 compares a threshold voltage (reference voltage) Vref with a power supply voltage Vcc of a power supply terminal 11 connected to the output terminal of the specific transistor Tr2A. The variable resistance circuit 6 is connected between the power supply terminal 11 and the output terminal of the specific transistor Tr2A. The control unit 55 controls the variable resistance circuit 6.

The amplifier circuit 2 includes a plurality of (for example, two) amplifier transistors Tr2.

In the amplifier circuit 2, as described above, the plurality of transistors Tr2 is connected in multiple stages.

The amplifier circuit 2 has the input terminal 27 and an output terminal 28. In the amplifier circuit 2, the input terminal (base) of the first-stage transistor Tr21 is connected to the input terminal 27 of the amplifier circuit 2 via the matching circuit 23. The output terminal (collector) of the first-stage transistor Tr21 is connected to the power supply terminal 11. The output terminal (collector) of the first-stage transistor Tr21 is connected to the input terminal (base) of the final-stage transistor Tr22 via the matching circuit 24. The common terminal (emitter) of the first-stage transistor Tr21 is grounded. The first-stage transistor Tr21 amplifies an input signal input to the input terminal and outputs the input signal from the output terminal.

The input terminal (base) of the final-stage transistor Tr22 is connected to the output terminal (collector) of the first-stage transistor Tr21 via the matching circuit 24. The terminal (collector) of the final-stage transistor Tr22 is connected to the power supply terminal 11. The output terminal of the final-stage transistor Tr22 is connected to the output terminal 28 of the amplifier circuit 2 via the matching circuit 24. The common terminal (emitter) of the final-stage transistor Tr22 is grounded.

The amplifier circuit 2 may have the matching circuit 25 provided between the output terminal of the final-stage transistor Tr22 and the output terminal 28 of the amplifier circuit 2.

The amplifier circuit 2 amplifies an input transmission signal with the first-stage transistor Tr21, further amplifies the transmission signal with the final-stage transistor Tr22, and outputs the transmission signal. In other words, the final-stage transistor Tr22 further amplifies the transmission signal amplified by the first-stage transistor Tr21 and outputs the transmission signal.

The bias circuit 3 has a plurality of (here, two) emitter followers 30 in a one-to-one correspondence with the plurality of (here, two) transistors Tr2. Each of the two emitter followers 30 includes a bipolar transistor Tr3. Each of the two emitter followers 30 supplies a bias current to the base of an associated one of the two transistors Tr2. The two bipolar transistors Tr3 are bias transistors.

Hereinafter, regarding the two emitter followers 30, the emitter follower 30 associated with the first-stage transistor Tr21 may be referred to as first emitter follower 31, and the emitter follower 30 associated with the final-stage transistor Tr22 may be referred to as second emitter follower 32. Regarding the two bipolar transistors Tr3, the bipolar transistor Tr3 included in the first emitter follower 31 may be referred to as first bipolar transistor Tr31, and the bipolar transistor Tr3 included in the second emitter follower 32 may be referred to as second bipolar transistor Tr32.

The base of the first bipolar transistor Tr31 is connected to a current source 52 included in the bias control circuit 54 via a resistance R31. The emitter of the first bipolar transistor Tr31 is connected to the input terminal (base) of the first-stage transistor Tr21. The collector of the first bipolar transistor Tr31 is connected to a battery terminal 12 of the radio-frequency circuit 100. The base of the second bipolar transistor Tr32 is connected to the current source 52 included in the bias control circuit 54 via a resistance R32. The emitter of the second bipolar transistor Tr32 is connected to the input terminal (base) of the final-stage transistor Tr22. The collector of the second bipolar transistor Tr32 is connected to the battery terminal 12. In the bias circuit 3, a current Ice from the battery terminal 12 is supplied to a junction point between the collectors of the plurality of bipolar transistors Tr3.

The bias control circuit 54 includes the current source 52 as described above. The current source 52 outputs the control current Icont. In the power amplifier circuit 1, the control current Icont is supplied to a junction point between the base of the first bipolar transistor Tr31 and the base of the second bipolar transistor Tr32. The control current Icont is a constant current.

The first emitter follower 31 supplies a bias current from the emitter of the first bipolar transistor Tr31 to the input terminal (base) of the first-stage transistor Tr21. The bias current is a bias signal for controlling a bias point (operating point) of the first-stage transistor Tr21.

The second emitter follower 32 supplies a bias current from the emitter of the second bipolar transistor Tr32 to the input terminal (base) of the final-stage transistor Tr22. The bias current is a bias signal for controlling a bias point (operating point) of the final-stage transistor Tr22.

Two diodes D311, D312 are connected in series between the ground and the base of the first bipolar transistor Tr31 included in the first emitter follower 31. Each of the two diodes D311, D312 is configured to connect the base and collector of an npn transistor.

Two diodes D321, D322 are connected in series between the ground and the base of the second bipolar transistor Tr32 included in the second emitter follower 32. Each of the two diodes D321, D322 is configured to connect the base and collector of an npn transistor.

The amplifier circuit 2 and the bias circuit 3 are included in, for example, one IC chip. The IC chip including the amplifier circuit 2 and the bias circuit 3 is, for example, a GaAs IC chip. In this case, each of the two transistors Tr2 is, for example, a heterojunction bipolar transistor (HBT).

The IC chip including the amplifier circuit 2 and the bias circuit 3 is not limited to a GaAs IC chip, and may be, for example, an Si IC chip having the amplifier circuit 2 or an SiGe IC chip having the amplifier circuit 2.

The bias control circuit 54 supplies the control current Icont to the bias circuit 3. The radio-frequency circuit 100 has a control circuit 5 including the bias control circuit 54.

The control circuit 5 is, for example, a control integrated circuit (IC) that controls the amplifier circuit 2 and the bias circuit 3. When the bias circuit 3 has a plurality of (here, two) emitter followers 30, the current Ice from the battery terminal 12 is diverted to the plurality of emitter followers 30. The control current Icont from the bias control circuit 54 is diverted to the bases of the two bipolar transistors Tr3 of the bias circuit 3.

The comparing section 4 compares the threshold voltage Vref with the power supply voltage Vcc of the power supply terminal 11 connected to the output terminal (collector) of the specific transistor Tr2A (here, the first-stage transistor Tr21). The power supply terminal 11 is, for example, a terminal connected to a power management integrated circuit (IC) 330 of the communication device 300 (see FIG. 1) and supplied with the power supply voltage Vcc from the power management IC 330.

The comparing section 4 includes a comparator CP1 that compares a threshold voltage Vref with the power supply voltage Vcc of the power supply terminal 11. The comparator CP1 has a first input terminal, a second input terminal, and an output terminal. The first input terminal of the comparator CP1 is connected to a node N1 between the power supply terminal 11 and the variable resistance circuit 6. The first input terminal of the comparator CP1 is connected to the power supply terminal 11 without necessarily intervening a circuit element. Therefore, no circuit element that generates a voltage drop, such as a resistive element, is provided between the power supply terminal 11 and the node N1. Thus, the power supply voltage Vcc is applied to the first input terminal of the comparator CP1. The threshold voltage Vref is applied from the control unit 55 of the control circuit 5 to the second input terminal of the comparator CP1. The output terminal of the comparator CP1 is connected to the control unit 55.

In the comparator CP1, for example, the first input terminal is a non-inverting input terminal, and the second input terminal is an inverting input terminal. In the comparing section 4, when the power supply voltage Vcc does not exceed the threshold voltage Vref, the signal level (voltage level) of an output signal from the output terminal of the comparator CP1 is a first level (also referred to as low level). In the comparing section 4, when the power supply voltage Vcc exceeds the threshold voltage Vref, the signal level of an output signal from the output terminal of the comparator CP1 is a second level (also referred to as high level) higher than the first level.

The variable resistance circuit 6 is connected between the power supply terminal 11 and the output terminal (collector) of the specific transistor Tr2A (first-stage transistor Tr21). More specifically, the variable resistance circuit 6 is connected between the above-described node N1 and the output terminal of the specific transistor Tr2A.

The variable resistance circuit 6 includes, for example, a parallel circuit 61 made up of a resistive element R1 and a switch element SW1. The resistance value of the variable resistance circuit 6 is changed in accordance with a compared result of the comparing section 4. The variable resistance circuit 6 is controlled by the control unit 55. The switch element SW1 is, for example, a semiconductor switch element having a control terminal and a pair of main terminals. The control unit 55 is connected to the control terminal, one of the pair of main terminals is connected to one end of the resistive element R1, and the other main terminal is connected to the other end of the resistive element R1. The semiconductor switch element is, for example, a normally-on metal-oxide-semiconductor field effect transistor (MOSFET).

The control circuit 5 further includes the control unit 55 that controls the variable resistance circuit 6 as described above. The control unit 55 controls the variable resistance circuit 6 in accordance with a compared result of the comparing section 4. In other words, the control unit 55 controls the switch element SW1 of the variable resistance circuit 6 in accordance with an output signal of the comparator CP1. The control unit 55 increases the resistance value of the variable resistance circuit 6 when the power supply voltage Vcc is higher than the threshold voltage Vref as compared to when the power supply voltage Vcc is lower than the threshold voltage Vref. In the radio-frequency circuit 100, when the signal level of the output signal of the comparator CP1 is the first level, the control unit 55 controls the switch element SW1 of the variable resistance circuit 6 to an on state; whereas, when the signal level of the output signal of the comparator CP1 is the second level, the control unit 55 controls the switch element SW1 of the variable resistance circuit 6 to an off state. Therefore, in the variable resistance circuit 6, when the power supply voltage Vcc is lower than the threshold voltage Vref, the resistance value of the variable resistance circuit 6 is substantially zero (about the on resistance of the switch element SW1); whereas, when the power supply voltage Vcc is higher than the threshold voltage Vref, the resistance value of the variable resistance circuit 6 is the resistance value of the resistive element R1. The resistance value of the resistive element R1 is greater than the on resistance of the switch element SW1. The threshold voltage Vref is a voltage higher by a predetermined voltage (for example, greater than or equal to 0.1 V and less than or equal to 0.2 V) than the rated power supply voltage of the power supply voltage Vcc.

The control circuit 5 and the comparator CP1 are included in, for example, one IC chip. The IC chip including the control circuit 5 and the comparator CP1 is, for example, an Si IC chip.

The control circuit 5 is connected to, for example, the signal processing circuit 301. The control circuit 5 controls the amplifier circuit 2 and the bias circuit 3 in accordance with a control signal acquired from the signal processing circuit 301. The control circuit 5 controls the amplifier circuit 2 and the bias circuit 3 in accordance with a control signal from the RF signal processing circuit 302 of the signal processing circuit 301.

(1.3) Operation of Radio-Frequency Circuit

In the radio-frequency circuit 100, the power amplifier circuit 1, for example, amplifies a transmission signal from the signal processing circuit 301 and outputs the transmission signal. In the power amplifier circuit 1, the amplifier circuit 2 amplifies an input signal that is an input transmission signal in a predetermined frequency band and outputs the input signal.

In the power amplifier circuit 1, when the power supply voltage Vcc of the power supply terminal 11 is the rated power supply voltage, the power supply voltage Vcc does not exceed the threshold voltage Vref, and the signal level of the output signal of the comparator CP1 is the first level. When the output signal of the comparator CP1 is the first level, the control unit 55 sets the switch element SW1 of the variable resistance circuit 6 to an on state. Thus, the specific transistor Tr2A is applied with a voltage substantially equal to the power supply voltage Vcc (a voltage lower by a voltage drop in the path between the power supply terminal 11 and the output terminal of the specific transistor Tr2A than the power supply voltage Vcc).

In the power amplifier circuit 1, when the power supply voltage Vcc of the power supply terminal 11 becomes a voltage higher by a predetermined voltage (for example, greater than or equal to 0.1 V and less than or equal to 0.2 V) or greater than the rated power supply voltage, the power supply voltage Vcc exceeds the threshold voltage Vref, and the signal level of the output signal of the comparator CP1 is the second level. When the output signal of the comparator CP1 is the second level, the control unit 55 sets the switch element SW1 of the variable resistance circuit 6 to an off state. Thus, the output terminal (collector) of the specific transistor Tr2A is applied with a voltage lower by a voltage drop in the resistive element R1 than the power supply voltage Vcc. Thus, in the power amplifier circuit 1, the saturated output power of the first-stage transistor Tr21 is limited, and the output power of the final-stage transistor Tr22 is limited. Therefore, in the power amplifier circuit 1, the input power-output power characteristics of the amplifier circuit 2 depend on the magnitude relation between the power supply voltage Vcc and the threshold voltage Vref.

(2) Summary (2.1) Radio-Frequency Circuit

A radio-frequency circuit 100 according to the embodiment includes an amplifier circuit 2, a bias circuit 3, a bias control circuit 54, a comparing section 4, a variable resistance circuit 6, and a control unit 55. The amplifier circuit 2 includes a specific transistor Tr2A. The specific transistor Tr2A has an input terminal and an output terminal. The specific transistor Tr2A amplifies a radio-frequency signal input to the input terminal and outputs the radio-frequency signal from the output terminal. The bias circuit 3 supplies a bias current or a bias voltage to the input terminal of the specific transistor Tr2A. The control circuit 5 supplies a control current Icont or a control voltage to the bias circuit 3. The comparing section 4 compares a threshold voltage Vref with a power supply voltage Vcc of a power supply terminal 11 connected to the output terminal of the specific transistor Tr2A. The variable resistance circuit 6 is connected between the power supply terminal 11 and the output terminal of the specific transistor Tr2A. The variable resistance circuit 6 includes a parallel circuit 61 made up of a resistive element R1 and a switch element SW1. The control unit 55 changes a resistance value of the variable resistance circuit 6 in accordance with a compared result of the comparing section 4.

The radio-frequency circuit 100 according to the embodiment is capable of further accurately limiting the output power of the amplifier circuit 2.

With the radio-frequency circuit 100 according to the embodiment, when the power supply voltage Vcc is higher than the threshold voltage Vref, the voltage applied to the output terminal of the specific transistor Tr2A of the amplifier circuit 2 is limited, so, for example, the radio-frequency circuit 100 is difficult to receive the influence of variations in the characteristics of the bias circuit 3 and is capable of further accurately limiting the output power of the amplifier circuit 2. Variations in the characteristics of the bias circuit 3 include, for example, variations in $h_{fe}$ (output short-circuit current gain) of the emitter follower 30.

With the radio-frequency circuit 100 according to the embodiment, of the plurality of transistors Tr2 included in the amplifier circuit 2, the first-stage transistor Tr2 is defined as the specific transistor Tr2A, and the variable resistance circuit 6 is connected to the specific transistor Tr2A. Therefore, in comparison with the case where the variable resistance circuit 6 is connected to the transistor Tr2 (here, the final-stage transistor Tr2) other than the first-stage transistor Tr21, a decrease in the characteristics (such as output power and operating efficiency) of the amplifier circuit 2 while the switch element SW1 is in an on state is suppressed.

A radio-frequency module including the radio-frequency circuit 100 includes a plurality of circuit elements (a GaAs IC chip and an Si IC chip of the power amplifier circuit 1, the first switch 102, the filter 103, the second switch 104, and the like) included in the radio-frequency circuit 100, and a mounting substrate on which the plurality of circuit elements is mounted. In the radio-frequency module, to reduce the size of the radio-frequency module, a reduction in the size of the filter 103 of which a footprint on the mounting substrate tends to increase, of the plurality of circuit elements, can be attempted. Here, the power handling capability of the filter 103 tends to decrease as the chip size of the filter 103 reduces. In the radio-frequency circuit 100 according to the embodiment, the output power of the amplifier circuit 2 can be accurately limited, so, for example, the degradation of the characteristics of the filter 103 can be suppressed, with the result that the design margin of the filter 103 is easily expanded.

(2.2) Communication Device

A communication device 300 according to the embodiment includes the radio-frequency circuit 100 and a signal processing circuit 301. The signal processing circuit 301 is connected to the radio-frequency circuit 100.

The communication device 300 according to the embodiment includes the radio-frequency circuit 100, so the communication device 300 is capable of further accurately limiting the output power of the amplifier circuit 2.

(3) Modifications (3.1) First Modification

Figure 3:
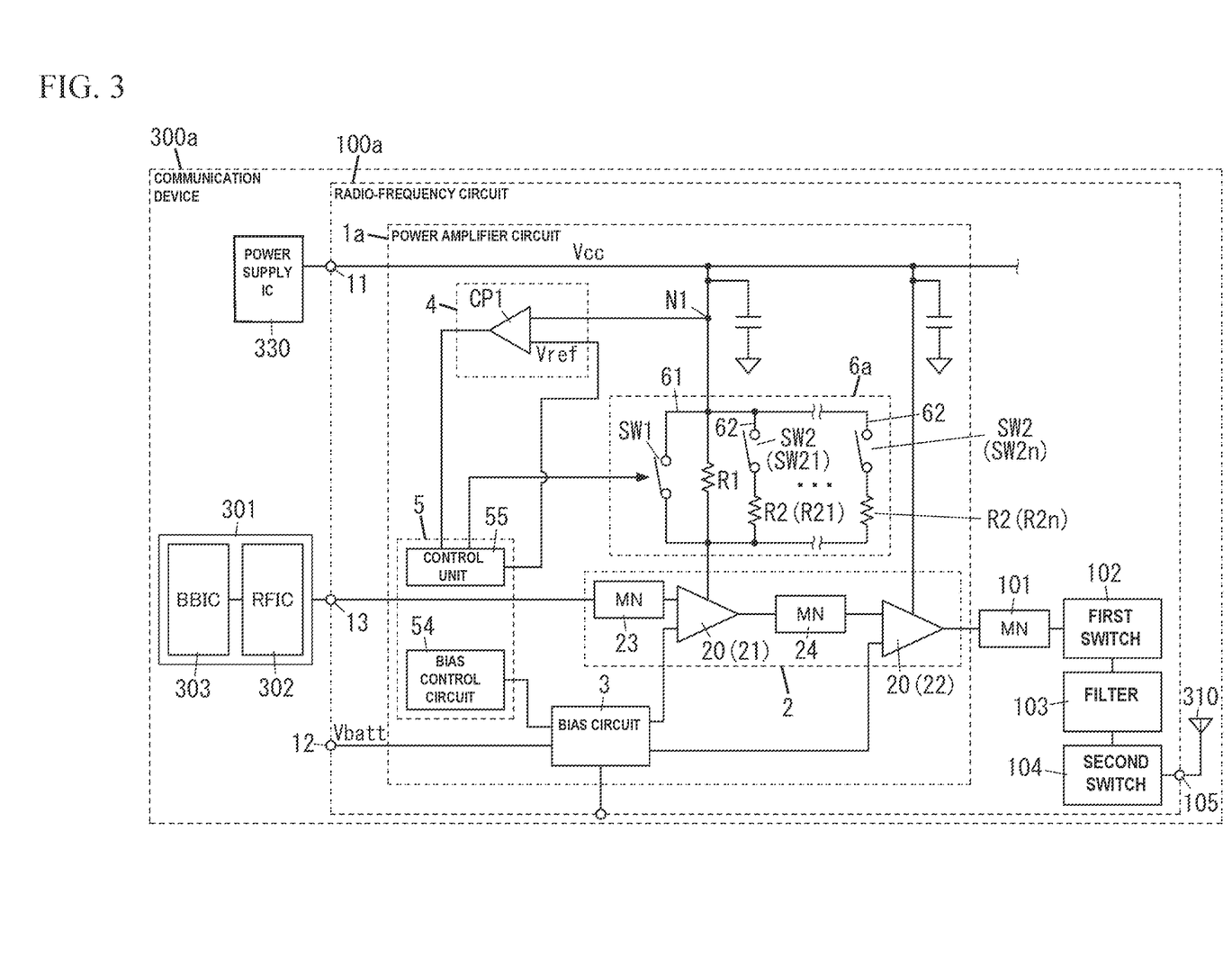
FIG. 3 is a circuit diagram of a communication device including a radio-frequency circuit according to a first modification of the embodiment.

A radio-frequency circuit 100a and a communication device 300a according to a first modification of the embodiment will be described with reference to FIG. 3. Regarding the radio-frequency circuit 100a and the communication device 300a according to the first modification, like reference signs denote similar component elements to those of the radio-frequency circuit 100 and the communication device 300 according to the embodiment, and the description thereof is omitted.

The radio-frequency circuit 100a according to the first modification differs from the radio-frequency circuit 100 according to the embodiment in that a power amplifier circuit 1a is provided instead of the power amplifier circuit 1 of the radio-frequency circuit 100 according to the embodiment. The communication device 300a according to the first modification differs from the communication device 300 according to the embodiment in that the radio-frequency circuit 100a is provided instead of the radio-frequency circuit 100 of the communication device 300 according to the embodiment.

The power amplifier circuit 1a includes a variable resistance circuit 6a instead of the variable resistance circuit 6 of the power amplifier circuit 1. Hereinafter, for the sake of convenience of description, the resistive element R1 in the parallel circuit 61 made up of the resistive element R1 and the switch element SW1, included in the variable resistance circuit 6a, is referred to as first resistive element R1, and the switch element SW1 in the parallel circuit 61 is also referred to as first switch element SW1. The variable resistance circuit 6a further includes at least one series circuit 62 made up of a second switch element SW2 and a second resistive element R2 and connected in parallel with the parallel circuit 61. For example, the variable resistance circuit 6a includes n (n is an integer greater than or equal to two) series circuits 62. Hereinafter, for the sake of convenience of description, the n second switch elements SW2 may also be referred to as n second switch elements SW21 to SW2n, and the n second resistive elements R2 may also be referred to as n second resistive elements R21 to R2n. Therefore, the variable resistance circuit 6a has the n second switch elements SW21 to SW2n and the n second resistive elements R21 to R2n. In the variable resistance circuit 6a, the resistance value of the first resistive element R1 and the resistance value of each of the n second resistive elements R21 to R2n are set to the same value; however, the configuration is not limited thereto. In the variable resistance circuit 6a, the on resistance of the first switch element SW1 and the on resistance of each of the n second switch elements SW21 to SW2n are set to the same value; however, the configuration is not limited thereto.

In the radio-frequency circuit 100a according to the first modification, the amplifier circuit 2, as in the case of the amplifier circuit 2 of the radio-frequency circuit 100 according to the first embodiment, is capable of operating in each of a plurality of (for example, three) communication bands (a first communication band, a second communication band, and a third communication band) different from one another. Therefore, the specific transistor Tr2A is capable of operating in each of the plurality of communication bands different from one another. In the radio-frequency circuit 100a according to the first modification, the control unit 55 changes the resistance value of the variable resistance circuit 6a in accordance with, of the plurality of communication bands, the communication band in which the specific transistor Tr2A operates. The control unit 55 can acquire information related to the communication band in which the specific transistor Tr2A operates from the signal processing circuit 301. The control unit 55 can change the resistance value of the variable resistance circuit 6a in accordance with, for example, a compared result of the comparing section 4 and a control signal including information on the communication band from the signal processing circuit 301.

In the radio-frequency circuit 100a according to the first modification, when, for example, the power supply voltage Vcc is lower than the threshold voltage Vref in accordance with the compared result of the comparing section 4, the control unit 55 sets the first switch element SW1 to an on state and sets the n second switch elements SW21 to SW2n to an off state. When it is assumed that, when, for example, the power supply voltage Vcc is higher than the threshold voltage Vref in accordance with the compared result of the comparing section 4, the control unit 55 sets the resistance value of the variable resistance circuit 6a to a maximum value in accordance with the first communication band, the control unit 55 sets the first switch element SW1 and the n second switch elements SW21 to SW2n to an off state. When it is assumed that, when the power supply voltage Vcc is higher than the threshold voltage Vref, the control unit 55 sets the resistance value of the variable resistance circuit 6a to a minimum value in accordance with the second communication band, the control unit 55 sets the first switch element SW1 to an off state and sets the n second switch elements SW21 to SW2n to an on state. When it is assumed that, when the power supply voltage Vcc is higher than the threshold voltage Vref, the control unit 55 sets the resistance value of the variable resistance circuit 6a to a value between the maximum value and the minimum value in accordance with the third communication band, the control unit 55 sets the first switch element SW1 to an off state and sets only one or some of the n second switch elements SW21 to SW2n to an on state.

The radio-frequency circuit 100a according to the first modification is capable of further accurately limiting the output power of the amplifier circuit 2 in any of the plurality of communication bands in which the specific transistor Tr2A operates.

(3.2) Second Modification

A radio-frequency circuit 100 according to a second modification has the same configuration as the radio-frequency circuit 100 according to the embodiment, so the description will be made with reference to FIGS. 1 and 2.

In the radio-frequency circuit 100 according to the second modification, the control unit 55 acquires information related to the rated power supply voltage of the power supply voltage Vcc applied to the power supply terminal 11 and changes the threshold voltage Vref in accordance with the information. The control unit 55 acquires information related to the rated power supply voltage of the power supply voltage Vcc from, for example, the signal processing circuit 301. More specifically, the control unit 55 acquires information related to the rated power supply voltage of the power supply voltage Vcc, included in a control signal (command) from the signal processing circuit 301.

In the radio-frequency circuit 100 according to the second modification, the control unit 55, for example, increases the threshold voltage Vref as the rated power supply voltage increases in accordance with information on the acquired rated power supply voltage.

In the radio-frequency circuit 100 according to the second modification, when, for example, the specifications of the rated power supply voltage of the power supply voltage Vcc applied to the power supply terminal 11 are changed, the threshold voltage Vref can be changed in accordance with the rated power supply voltage.

Other Modifications

The above-described embodiment is just one of various embodiments of the present disclosure. The above-described embodiment may be modified into various forms according to design, or the like.

For example, in the radio-frequency circuits 100, 100a, the number of stages of the transistors Tr2 connected in the amplifier circuit 2 is two; however, the configuration is not limited thereto. The number of stages of the transistors Tr2 connected may be three or more. The amplifier circuit 2 is not limited to a configuration having a plurality of transistors Tr2 and may be the one having at least one transistor Tr2. In short, in the radio-frequency circuits 100, 100a, the number of transistors Tr2 may be one. In this case, the number of the emitter followers 30 and the number of the bipolar transistors Tr3 in the bias circuit 3 each may be one. In the radio-frequency circuits 100, 100a, the first-stage transistor Tr21 is set as the specific transistor Tr2A; however, the configuration is not limited thereto. The final-stage transistor Tr22 may be set as the specific transistor Tr2A or each of the first-stage transistor Tr21 and the final-stage transistor Tr22 may be set as the specific transistor Tr2A. When the number of stages of the transistors Tr2 connected is three or more, the transistor Tr2 other than both the first-stage transistor Tr21 and the final-stage transistor Tr22 may be set as the specific transistor Tr2A.

The transistors Tr2 in the amplifier circuit 2 are not limited to bipolar transistors and may be field effect transistors (FETs). When the transistors Tr2 are FETs, the gate, the drain, and the source are respectively an input terminal, an output terminal, and a common terminal.

In the radio-frequency circuits 100, 100a, for example, the first switch 102, the filter 103, and the second switch 104 are not indispensable component elements and are additional component elements.

In the radio-frequency circuit 100, the filter 103 is an acoustic wave filter that uses surface acoustic waves; however, the configuration is not limited thereto. The filter 103 may be, for example, an acoustic wave filter that uses boundary acoustic waves, plate waves, or the like.

In the acoustic wave filter, each of the plurality of series arm resonators and the plurality of parallel arm resonators is not limited to an SAW resonator and may be, for example, a bulk acoustic wave (BAW) resonator.

The radio-frequency circuits 100, 100a each may include a receiving circuit including a low-noise amplifier that amplifies a reception signal input from the antenna terminal 105 and a filter connected to the low-noise amplifier.

The filter 103 is not limited to a transmission filter and may be a duplexer.

In the radio-frequency circuits 100, 100a, the first switch 102 and the second switch 104 may be, for example, a switch IC corresponding to a general purpose input/output (GPIO).

(Aspects)

The following aspects are disclosed in the specification.

A radio-frequency circuit (100; 100a) according to a first aspect includes an amplifier circuit (2), a bias circuit (3), a bias control circuit (54), a comparing section (4), a variable resistance circuit (6; 6a), and a control unit (55). The amplifier circuit (2) includes a specific transistor (Tr2A). The specific transistor (Tr2A) has an input terminal and an output terminal. The specific transistor (Tr2A) amplifies a radio-frequency signal input to the input terminal and outputs the radio-frequency signal from the output terminal. The bias circuit (3) supplies a bias current or a bias voltage to the input terminal of the specific transistor (Tr2A). The bias control circuit (54) supplies a control current (Icont) or a control voltage to the bias circuit (3). The comparing section (4) compares a threshold voltage (Vref) with a power supply voltage (Vcc) of a power supply terminal (11) connected to the output terminal of the specific transistor (Tr2A). The variable resistance circuit (6; 6a) is connected between the power supply terminal (11) and the output terminal. The variable resistance circuit (6; 6a) includes a parallel circuit (61) made up of a resistive element (R1) and a switch element (SW1). The control unit (55) changes a resistance value of the variable resistance circuit (6; 6a) in accordance with a compared result of the comparing section (4).

The radio-frequency circuit (100; 100a) according to the first aspect is capable of further accurately limiting the output power of the amplifier circuit (2).

In the power amplifier circuit (100; 100a) according to a second aspect, in the first aspect, the control unit (55) increases the resistance value of the variable resistance circuit (6; 6a) when the power supply voltage (Vcc) is higher than the threshold voltage (Vref) as compared to when the power supply voltage (Vcc) is lower than the threshold voltage (Vref).

With the radio-frequency circuit (100; 100a) according to the second aspect, when the power supply voltage (Vcc) is higher than the threshold voltage (Vref), the output power of the amplifier circuit (2) can be accurately limited.

In the radio-frequency circuit (100a) according to a third aspect, in the second aspect, the resistive element (R1) of the parallel circuit (61) is defined as a first resistive element, and the switch element (SW1) of the parallel circuit (61) is defined as a first switch element. The variable resistance circuit (6a) further includes at least one series circuit (62) made up of a second switch element (SW2) and a second resistive element (R2) and connected in parallel with the parallel circuit (61).

With the radio-frequency circuit (100a) according to the third aspect, when the power supply voltage (Vcc) is higher than the threshold voltage (Vref), the output power of the amplifier circuit (2) can be further accurately limited.

In the radio-frequency circuit (100a) according to a fourth aspect, in any one of the first to third aspects, the specific transistor (Tr2A) is capable of operating in each of a plurality of communication bands different from each other. The control unit (55) changes the resistance value of the variable resistance circuit (6a) in accordance with, of the plurality of communication bands, the communication band in which the specific transistor (Tr2A) operates.

With the radio-frequency circuit (100a) according to the fourth aspect, the output power of the amplifier circuit (2) can be further accurately limited in accordance with the communication band in which the specific transistor (Tr2A) operates.

In the radio-frequency circuit (100; 100a) according to a fifth aspect, in any one of the first to fourth aspects, the control unit (55) acquires information related to a rated power supply voltage of the power supply terminal (11) and changes the threshold voltage (Vref) in accordance with the information.

With the radio-frequency circuit (100; 100a) according to the fifth aspect, when, for example, the specifications of the rated power supply voltage of the power supply voltage (Vcc) applied to the power supply terminal (11) are changed, the threshold voltage (Vref) can be changed in accordance with the rated power supply voltage.

In the radio-frequency circuit (100; 100a) according to a sixth aspect, in any one of the first to fifth aspects, the comparing section (4) includes a comparator (CP1) that compares the threshold voltage (Vref) with the power supply voltage (Vcc) of the power supply terminal (11). The control unit (55) changes the resistance value of the variable resistance circuit (6; 6a) in accordance with an output of the comparator (CP1).

With the radio-frequency circuit (100; 100a) according to the sixth aspect, in comparison with the case where the power supply voltage (Vcc) of the power supply terminal (11) is divided in accordance with resistances by a resistance voltage circuit and is compared with the threshold voltage, a voltage drop between the power supply terminal (11) and the output terminal of the specific transistor (Tr2A) is reduced, so a decrease in the output power of the amplifier circuit (2) and a decrease in operation efficiency can be suppressed.

In the radio-frequency circuit (100; 100a) according to a seventh embodiment, in any one of the first to sixth aspects, the amplifier circuit (2) has a plurality of transistors (Tr2) including the specific transistor (Tr2A). In the amplifier circuit (2), the plurality of transistors (Tr2) is connected in multiple stages.

With the radio-frequency circuit (100; 100a) according to the seventh aspect, the output power of the amplifier circuit (2) can be increased.

In the radio-frequency circuit (100; 100*a*) according to an eighth aspect, in the seventh aspect, the specific transistor (Tr2A) is one of the plurality of transistors (Tr2), other than a final-stage transistor (Tr2).

With the radio-frequency circuit (100; 100*a*) according to the eighth aspect, in comparison with the case where the variable resistance circuit (6; 6*a*) is connected to the final-stage transistor (Tr2), a decrease in the characteristics (such as output power and operating efficiency) of the amplifier circuit (2) when the switch element (SW1) is in an on state can be suppressed.

In the radio-frequency circuit (100; 100*a*) according to a ninth aspect, in the eighth aspect, the specific transistor (Tr2) is a first-stage transistor (Tr2), of the plurality of transistors (Tr2).

With the radio-frequency circuit (100; 100*a*) according to the ninth aspect, in comparison with the case where the variable resistance circuit (6; 6*a*) is connected to the transistor (Tr2) other than the first-stage transistor (Tr2), a decrease in the characteristics (such as output power and operating efficiency) of the amplifier circuit (2) when the switch element (SW1) is in an on state can be suppressed.

A communication device (300; 300*a*) according to a tenth aspect includes the radio-frequency circuit (100; 100*a*) that is any one of the first to ninth aspects, and a signal processing circuit (301). The signal processing circuit (301) is connected to the radio-frequency circuit (100; 100*a*).

The communication device (300; 300*a*) according to the tenth aspect is capable of further accurately limiting the output power of the amplifier circuit (2).

REFERENCE SIGNS LIST

1, 1*a* power amplifier circuit
2 amplifier circuit
20 amplifier
21 first-stage amplifier
22 final-stage amplifier
23 matching circuit
24 matching circuit
25 matching circuit
27 input terminal
28 output terminal
3 bias circuit
30 emitter follower
31 first emitter follower
32 second emitter follower
4 comparing section
5 control circuit
52 current source
54 bias control circuit
55 control unit
6, 6*a* variable resistance circuit
61 parallel circuit
62 series circuit
11 power supply terminal
12 battery terminal
100, 100*a* radio-frequency circuit
101 output matching circuit
102 first switch
103 filter
104 second switch
105 antenna terminal
300, 300*a* communication device
301 signal processing circuit
302 RF signal processing circuit
303 baseband signal processing circuit
310 antenna
330 power management IC
CP1 comparator
D311, D312, D321, D322 diode
Ice current
Icont control current
R1 resistive element (first resistive element)
R2, R21 to R2*n* second resistive element
R31 resistance
R32 resistance
SW1 switch element (first switch element)
SW2 second switch element
Tr2 transistor
Tr21 first-stage transistor
Tr22 final-stage transistor
Tr2A specific transistor
Tr3 bipolar transistor
Tr31 first bipolar transistor
Tr32 second bipolar transistor
Vcc power supply voltage
Vbatt battery voltage
Vref threshold voltage

The invention claimed is:

1. A radio-frequency circuit comprising:
an amplifier circuit comprising a specific transistor that has an input terminal and an output terminal, and that is configured to amplify a radio-frequency signal input to the input terminal and to output an amplified radio-frequency signal from the output terminal;
a bias circuit configured to supply a bias current or a bias voltage to the input terminal of the specific transistor;
a bias control circuit configured to supply a control current or a control voltage to the bias circuit;
comparing circuitry configured to compare a threshold voltage with a power supply voltage of a power supply terminal, the power supply terminal being connected to the output terminal of the specific transistor;
a variable resistance circuit connected between the power supply terminal and the output terminal, and comprising a first resistive circuit element and a first switch connected in parallel with each other; and
control circuitry configured to change a resistance value of the variable resistance circuit in accordance with a result of the comparing circuitry.

2. The radio-frequency circuit according to claim 1, wherein the control circuitry is configured to increase the resistance value of the variable resistance circuit when the power supply voltage is greater than the threshold voltage.

3. The radio-frequency circuit according to claim 2, wherein the variable resistance circuit further comprises a second switch and a second resistive circuit element connected in series with each other and connected in parallel with the first resistive circuit element and the first switch.

4. The radio-frequency circuit according to claim 1,
wherein the specific transistor is configured to operate in each of a plurality of communication bands that are different from each other, and
the control circuitry is configured to change the resistance value of the variable resistance circuit in accordance with the communication band of the plurality of communication bands in which the specific transistor operates.

5. The radio-frequency circuit according to claim 1, wherein the control circuitry is configured to acquire information related to a rated power supply voltage of the power supply voltage applied to the power supply terminal and to change the threshold voltage in accordance with the information.

6. The radio-frequency circuit according to claim 1,
wherein the comparing circuitry comprises a comparator that is configured to compare the power supply voltage of the power supply terminal with the threshold voltage, and
wherein the control circuitry is configured to change the resistance value of the variable resistance circuit in accordance with an output of the comparator.

7. The radio-frequency circuit according to claim 1,
wherein the amplifier circuit comprises a plurality of transistors including the specific transistor, and
wherein in the amplifier circuit, the plurality of transistors are connected in multiple stages.

8. The radio-frequency circuit according to claim 7, wherein the specific transistor is not a final-stage transistor of the plurality of transistors.

9. The radio-frequency circuit according to claim 8, wherein the specific transistor is a first-stage transistor of the plurality of transistors.

10. A communication device comprising:
the radio-frequency circuit according to claim 1; and
a signal processing circuit connected to the radio-frequency circuit.

* * * * *